United States Patent
Huang

(10) Patent No.: US 8,716,145 B2
(45) Date of Patent: May 6, 2014

(54) CRITICAL CONCENTRATION IN ETCHING DOPED POLY SILICON WITH HF/HNO$_3$

(75) Inventor: Shuogang Huang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/305,889

(22) Filed: Nov. 29, 2011

(65) Prior Publication Data

US 2013/0137277 A1   May 30, 2013

(51) Int. Cl.
*H01L 21/302* (2006.01)
*H01L 21/461* (2006.01)

(52) U.S. Cl.
USPC .......... 438/753; 438/745; 438/705; 438/689; 216/83

(58) Field of Classification Search
USPC ............ 216/83; 252/79.1; 257/770; 438/144, 438/253, 254, 356, 430, 439, 689, 705, 745, 438/746, 753
See application file for complete search history.

(56) References Cited

U.S. PATENT DOCUMENTS

| | | | |
|---|---|---|---|
| 3,892,606 A * | 7/1975 | Chappelow et al. .......... | 438/585 |
| 5,518,966 A | 5/1996 | Woo | |
| 6,316,370 B1 * | 11/2001 | Mercaldi et al. .............. | 438/745 |
| 6,524,901 B1 | 2/2003 | Trivedi | |
| 7,344,999 B2 | 3/2008 | Mun et al. | |
| 2010/0167514 A1 | 7/2010 | Kirkpatrick et al. | |

FOREIGN PATENT DOCUMENTS

| JP | 06120445 A | 4/1994 |
|---|---|---|
| WO | 2011041268 A1 | 4/2011 |

OTHER PUBLICATIONS

SILICONFAREAST; Wet Etching Recipes; 2005; www.SiliconFarEast.com; http://www.siliconfareast.com/etch_recipes.htm; 2 pages.

White, R., et al; Isotropic Silicon Etching Using HF/Nitric/Acetic Acid (HNA), Standard Operating Procedure; Jun. 6, 2007; Tufts University; 5 pages.

Yongliang et al; Selective wet etch of a TaN metal gate with an amorphous-silicon hard mask; Nov. 2010; Journal of Semiconductors, vol. 31, No. 11; Chinese Institute of Electronics; pp. 116001-1-116001-4.

* cited by examiner

*Primary Examiner* — Nadine Norton
*Assistant Examiner* — Erin Bergner

(57) ABSTRACT

In some embodiments, the present invention discloses an etchant solution hydrochloric acid and nitric acid to etch doped polysilicon at low etch rates. The doped polysilicon can be doped with Ge, In, B and Ga. Preferably, the concentration of hydrochloric acid can be greater than 1 vol %, and the concentration of nitric acid is greater than 15 vol %.

17 Claims, 3 Drawing Sheets

CRITICAL CONCENTRATION IN ETCHING DOPED POLY SILICON WITH HF/HNO$_3$

FIELD OF THE INVENTION

The present invention relates to wet chemical etching of substrates, and particular to etching of doped polysilicon using an etchant comprising hydrofluoric acid and nitric acid.

BACKGROUND OF THE INVENTION

Wet etching, which utilizes a solution of chemical etchant, is a common process in the fabrication of semiconductor devices. A typical solution of chemical etchant for polysilicon consists mainly of nitric acid (HNO3) as an oxidizer agent and hydrofluoric acid (HF) as a reducing agent in diluting agent of water. During the etching process, oxygen radicals of nitric acid react with silicon to form silicon oxide, which is then etched by hydrofluoric acid.

The polysilicon etch rate is generally determined by both the formation rate of silicon oxide through nitric acid and the removal rate of the silicon oxide by the hydrofluoric acid. High etch rates of about 300 to about 400 nm/min can be achieved with a volume ratio of 1 part of hydrofluoric acid in 3 parts of nitric acid in 5 parts of water.

Doped polysilicon is also utilized in semiconductor device fabrication process, for example, polysilicon can be doped with boron, phosphorous or arsenic to increase its conductivity. Further, in the device fabrication processes, etch selectivity between doped polysilicon and undoped polysilicon is also needed, requiring high etch rate for doped polysilicon film with minimum etch rate of undoped polysilicon, such as the silicon crystal substrate. The etch selectivity is not met by the typical polysilicon etchant, for example, the doped polysilicon usually cannot not be etched as precisely as necessary.

Etching solutions comprising hydrofluoric acid, nitric acid and acetic acid (HNA) has been shown to offer the required selectivity between highly doped polysilicon and lightly doped polysilicon. For example, an etching solution comprises 1 part of hydrofluoric acid, 3 parts of nitric acid, and 8 parts acetic acid by volume would achieve 0.7 to 3 micron/min for highly doped polysilicon while lightly doped polysilicon is not significantly etched.

Advanced semiconductor device fabrication requires smaller device geometry, and thus the need for uniform and precision etching in much lower etch rates. In a typical chemical etch process, the slow etch rate becomes critical to the successful fabrication of an intended device geometry.

Diluting the doped polysilicon HNA etchant with water or acetic acid can slow the etch rate, but can result in polysilicon residue. Thus there is a need for an etchant solution for doped silicon at low etch rates, such as less than 20 nm/min.

SUMMARY OF THE DISCLOSURE

In some embodiments, the present invention discloses a critical concentration of an etchant solution comprising hydrochloric acid and nitric acid to etch doped polysilicon at low etch rates and at room temperature. Below the critical concentration, the etchant solution barely affects the doped polysilicon surface, for example, resulting in an etch rate of less than 0.05 nm/min. In some embodiments, the etchant solution at below critical concentration can form doped polysilicon with rough surface and polysilicon residues. Above the critical concentration, the etch rates increase significantly, for example, at 100 times higher.

In some embodiments, the present invention discloses an etchant solution comprising hydrochloric acid and nitric acid to etch doped polysilicon at low etch rates. The etchant solution can comprise between 1 to 5 vol % of hydrofluoric acid and 10 to 30 vol % of nitric acid.

In some embodiments, the etchant solution can etch doped polysilicon, e.g., at an etch rate of at least 0.05 nm/min. The maximum etch rate of the etchant solution can be less than 20 nm/min.

In some embodiments, the present invention discloses an etchant solution comprising hydrochloric acid and nitric acid to etch doped polysilicon at an etch rate of less than 100 nm/min. The etchant solution can comprise more than 1 vol % of hydrofluoric acid and more than 10 vol % of nitric acid.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION OF THE PREFERRED EMBODIMENTS

Figure 1:
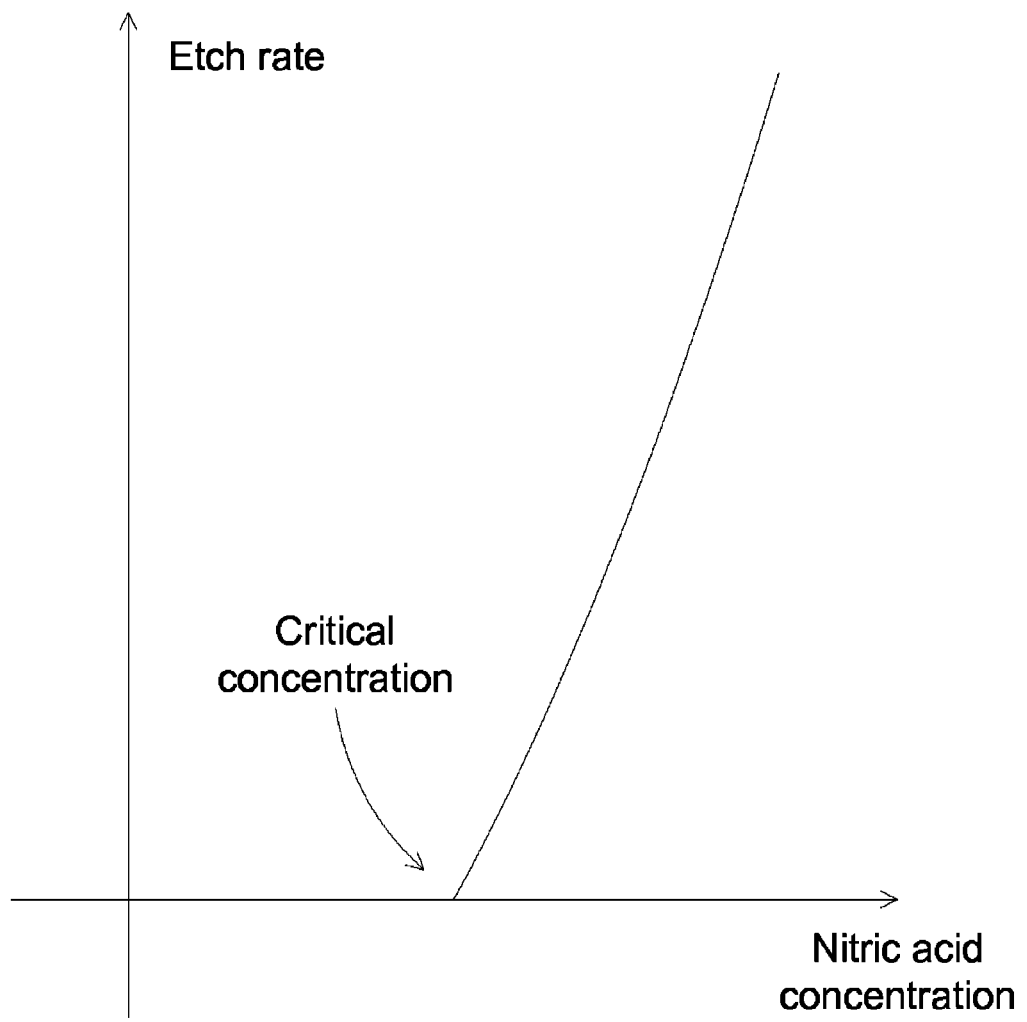
FIG. 1 illustrates a schematic characteristic of the etch rates with respect to the nitric acid concentration according to some embodiments of the present invention.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, the present invention discloses a process to etch doped polysilicon at low etch rates. The low etch rate process can enable the control of etching thin doped polysilicon layers, for example, to achieve a desired thickness or to prevent over etching which can damage an underlayer.

In some embodiments, the present invention discloses an etchant solution comprising hydrochloric acid and nitric acid to etch doped polysilicon at controllable rates. The etch rates of the present etchant solution decreases non-linearly with lower concentrations, and below a critical concentration, for example, of nitric acid in the etchant solution, significantly drops to negligible etch rates, for example, the reduction of the etch rate across the critical concentration is about 100 times. In some embodiments, the negligible etch rate is less than about 0.05 nm/min.

In some embodiments, the present invention discloses a critical concentration of an etchant solution comprising hydrochloric acid and nitric acid to enable etching of doped polysilicon.

In some embodiments, the doped polysilicon comprises one or more dopants selected from a group consisting of Ge, In, B, Ga, Al, P, N, and Sb. In some embodiments, the doped polysilicon preferably comprises one or more dopants of Ge, In, B, and Ga. In some embodiments, the doped polysilicon comprises the dopants of Ge, In, B, and Ga. Each dopant concentration can be less than $1 \times 10^{19}$ atoms/cm$^3$, preferably less than $1 \times 10^{18}$ atoms/cm$^3$, and more preferably less than $1 \times 10^{17}$ atoms/cm$^3$.

Since the polysilicon etch rate is determined by both the formation rate of silicon oxide through nitric acid and the removal rate of the silicon oxide by the hydrofluoric acid, lowering either rates, i.e., formation rate or removal rate, would effectively lower the etch rate. Thus if the concentration of nitric acid in the etchant solution reduces the oxide formation rate to be negligible, the polysilicon etch rate would also become negligible. Similarly, is the concentration of hydrofluoric acid in the etchant solution reduces the oxide removal rate to be negligible, the polysilicon etch rate would also become negligible. Preferably, the doped polysilicon etch rate is controlled through the nitric acid concentration, since there will be negligible silicon oxide in the doped polysilicon layer.

In some embodiments, the etchant solution is prepared with 100:1 dilute hydrofluoric acid, with 70 weight % nitric acid slowly added. The etchant solutions were prepared using volume ratios and were constantly stirred during the mixing of nitric acid to the hydrofluoric solution. Substrates having a doped polysilicon layer were etched by being immersed in the etchant baths. The etchant solutions were prepared, and the etching processes were performed at room temperature. The thicknesses of the doped polysilicon layer were measured optically using ellipsometry, and the etch rates determined.

FIG. 1 illustrates a schematic characteristic of the etch rates with respect to the nitric acid concentration according to some embodiments of the present invention. In this etch rate curve, the concentration of the hydrofluoric acid is fixed at 1 vol %. Below the critical concentration of nitric acid, which is about 15 vol %, the substrate is barely etched, for example, at an etch rate of less than 0.05 nm/min. Once the nitric acid passes the critical concentration, the etch rates jumps at least 100 times, to about 5 nm/min. The etchant solution can provide a low and reproducible etch rate of doped polysilicon layers, together with a clean surface.

At high etching temperature, e.g., higher temperature of the etchant solution, the critical concentration is shifted to a lower value, meaning that at high temperatures, the doped polysilicon can be similarly etched at a lower nitric acid concentration. In some embodiments, the compositions for the etchant solution comprise lower than 15 (or preferably lower than 10) vol % of nitric acid. In some embodiments, the compositions for the etchant solution comprise lower than 1 vol % of hydrofluoric acid with lower than 15 (or preferably lower than 10) vol % of nitric acid.

In some embodiments, the present etchant solution is directed to low etch rates, for example, to achieve a desired etch controllability of the doped polysilicon layer. In some embodiments, the maximum desired etch rate is about 20 nm/min. In some embodiments, the maximum desired etch rate can be obtained by varying the concentrations of hydrofluoric acid and nitric acid in the etchant solution. To achieve the desired etch rate, the concentration of hydrofluoric acid can be less than about 5 vol %, and the concentration of nitric acid can be less than about 30 vol %.

Figure 2:
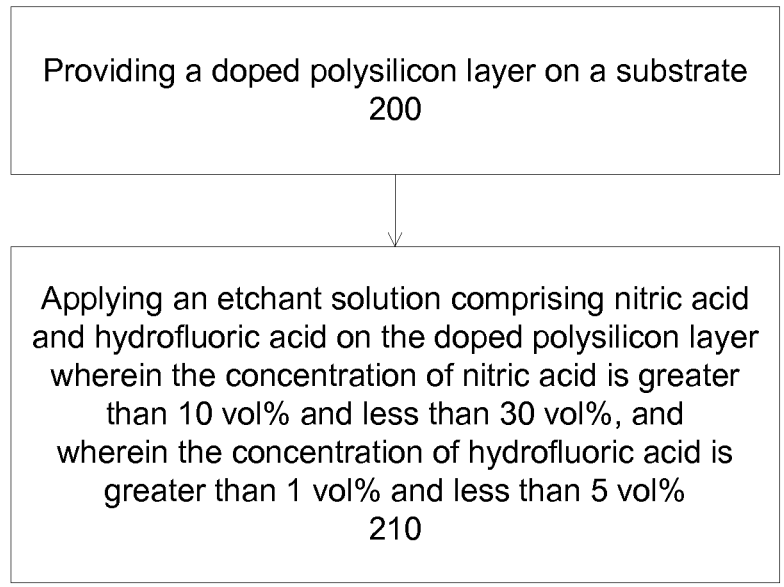
FIG. 2 illustrates an exemplary flowchart of an exemplary doped polysilicon etching process according to some embodiments of the present invention.

FIG. 2 illustrates an exemplary flowchart of an exemplary doped polysilicon etching process according to some embodiments of the present invention. In operation 200, a substrate comprising a doped polysilicon layer is provided. In operation 210, an etchant solution comprising nitric acid and hydrofluoric acid is applied on the doped polysilicon layer, wherein the concentration of nitric acid is greater than 10 vol % and less than 30 vol %, and wherein the concentration of hydrofluoric acid is greater than 1 vol % and less than 5 vol %.

In some embodiments, the present invention discloses a method to etch doped polysilicon. An exemplary method comprises providing a doped polysilicon layer on a substrate; and applying an etchant solution comprising nitric acid and hydrofluoric acid on the doped polysilicon layer, wherein the concentration of nitric acid is greater than 10 vol % and less than 30 vol %, and wherein the concentration of hydrofluoric acid is greater than 1 vol % and less than 5 vol %. In some embodiments, the concentration of nitric acid is greater than 15 vol %. The doped polysilicon layer can comprise one or more dopants selected from a group consisting of Ge, In, B, Ga, Al, P, N, and Sb, and preferably comprises dopants of Ge, In, B, and Ga. In some embodiments, at least one dopant concentration of the doped polysilicon layer is less than $1 \times 10^{18}$ atoms/cm$^3$.

Figure 3:
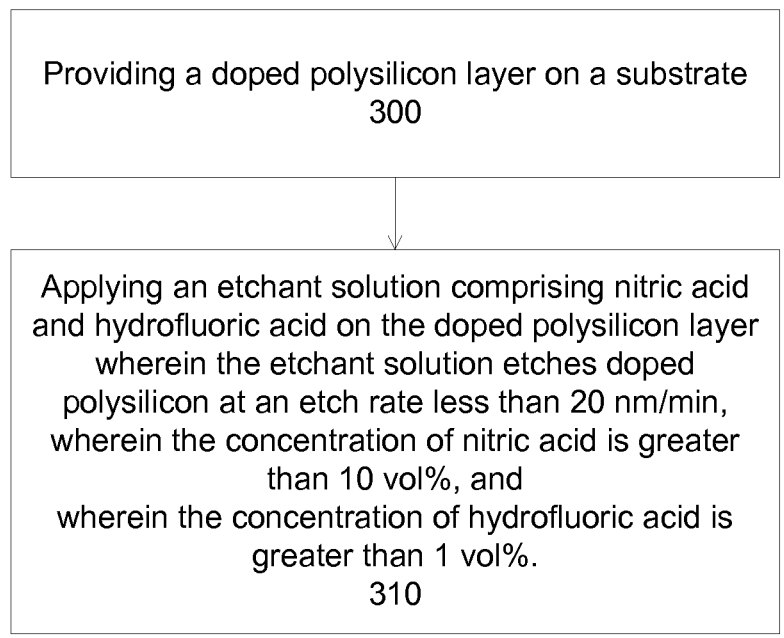
FIG. 3 illustrates another exemplary flowchart of an exemplary doped polysilicon etching process according to some embodiments of the present invention.

FIG. 3 illustrates another exemplary flowchart of an exemplary doped polysilicon etching process according to some embodiments of the present invention. In operation 300, a substrate comprising a doped polysilicon layer is provided. In operation 310, an etchant solution comprising nitric acid and hydrofluoric acid is applied on the doped polysilicon layer, wherein the etchant solution etches doped polysilicon at an etch rate less than 20 nm/min, wherein the concentration of nitric acid is greater than 10 vol %, and wherein the concentration of hydrofluoric acid is greater than 1 vol %.

In some embodiments, the present invention discloses another method to etch doped polysilicon. An exemplary method comprises providing a doped polysilicon layer on a substrate; and applying an etchant solution comprising nitric acid and hydrofluoric acid on the doped polysilicon layer, wherein the etchant solution etches doped polysilicon at an etch rate less than 20 nm/min, wherein the concentration of nitric acid is greater than 10 vol %, and wherein the concentration of hydrofluoric acid is greater than 1 vol %. In some embodiments, the concentration of nitric acid is greater than 15 vol %, and less than 30 vol %. The concentration of hydrofluoric acid can be less than 5 vol %. The doped polysilicon layer can comprise one or more dopants selected from a group consisting of Ge, In, B, Ga, Al, P, N, and Sb, and preferably comprises dopants of Ge, In, B, and Ga. In some embodiments, at least one dopant concentration of the doped polysilicon layer is less than $1 \times 10^{18}$ atoms/cm$^3$.

Figure 4:
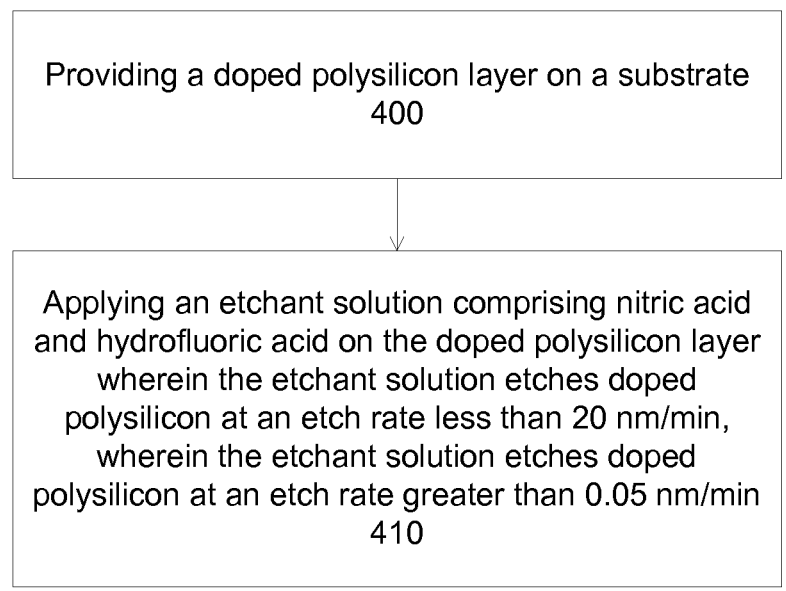
FIG. 4 illustrates another exemplary flowchart of an exemplary doped polysilicon etching process according to some embodiments of the present invention.

FIG. 4 illustrates another exemplary flowchart of an exemplary doped polysilicon etching process according to some embodiments of the present invention. In operation 400, a substrate comprising a doped polysilicon layer is provided. In operation 410, an etchant solution comprising nitric acid and hydrofluoric acid is applied on the doped polysilicon layer, wherein the etchant solution etches doped polysilicon at an etch rate less than 20 nm/min, and wherein the etchant solution etches doped polysilicon at an etch rate greater than 0.05 nm/min In some embodiments, the present invention discloses a method to etch doped polysilicon. An exemplary method comprises providing a doped polysilicon layer on a substrate; and applying an etchant solution comprising nitric acid and hydrofluoric acid on the doped polysilicon layer, wherein the etchant solution etches doped polysilicon at an etch rate less than 20 nm/min, and wherein the etchant solution etches doped polysilicon at an etch rate greater than 0.05 nm/min. In some embodiments, the concentration of nitric acid is greater than 15 vol % and less than 30 vol %. The concentration of hydrofluoric acid can be greater than 1 vol % and less than 5 vol %. The doped polysilicon layer can comprise one or more dopants selected from a group consisting of Ge, In, B, Ga, Al, P, N, and Sb, and preferably comprises dopants of Ge, In, B, and Ga. In some embodiments, at least one dopant concentration of the doped polysilicon layer is less than $1 \times 10^{18}$ atoms/cm$^3$.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method to etch doped polysilicon comprising
providing a doped polysilicon layer on a substrate;
applying an etchant solution on the doped polysilicon layer, wherein the etchant solution consists of dilute nitric acid and dilute hydrofluoric acid,
wherein the concentration of nitric acid is greater than 10 vol % and less than 30 vol %,
wherein the concentration of hydrofluoric acid is greater than 1 vol % and less than 5 vol %, and
wherein the doped polysilicon layer comprises dopants of Ge, In, B and Ga.

2. A method as in claim 1 wherein the concentration of nitric acid is greater than 15 vol %.

3. A method as in claim 1 wherein the doped polysilicon layer further comprises one or more dopants selected from a group consisting of Al, P, N, and Sb.

4. A method as in claim 1 wherein at least one dopant concentration of the doped polysilicon layer is less than $1 \times 10^{18}$ atoms/cm$^3$.

5. A method to etch doped polysilicon comprising
providing a doped polysilicon layer on a substrate; and
applying an etchant solution on the doped polysilicon layer, wherein the etchant solution consists of dilute nitric acid and dilute hydrofluoric acid,
wherein the etchant solution etches doped polysilicon at an etch rate less than 20 nm/min,
wherein the concentration of nitric acid is greater than 10 vol %,
wherein the concentration of hydrofluoric acid is greater than 1 vol %, and
wherein the doped polysilicon layer comprises dopants of Ge, In, B, and Ga.

6. A method as in claim 5 wherein the concentration of nitric acid is greater than 15 vol %.

7. A method as in claim 5 wherein the concentration of nitric acid is less than 30 vol %.

8. A method as in claim 5 wherein the concentration of hydrofluoric acid is less than 5 vol %.

9. A method as in claim 5 wherein the doped polysilicon layer further comprises one or more dopants selected from a group consisting of Al, P, N, and Sb.

10. A method as in claim 5 wherein at least one dopant concentration of the doped polysilicon layer is less than $1 \times 10^{18}$ atoms/cm$^3$.

11. A method to etch doped polysilicon comprising
providing a doped polysilicon layer on a substrate; and
applying an etchant solution on the doped polysilicon layer, wherein the etchant solution consists of dilute comprising nitric acid and dilute hydrofluoric acid on the doped polysilicon layer,
wherein the etchant solution etches doped polysilicon at an etch rate less than 20 nm/min,
wherein the etchant solution etches doped polysilicon at an etch rate greater than 0.05 nm/min, and
wherein the doped polysilicon layer comprises dopants of Ge, In, B, and Ga.

12. A method as in claim 11 wherein the concentration of nitric acid is greater than 15 vol %.

13. A method as in claim 11 wherein the concentration of nitric acid is less than 30 vol %.

14. A method as in claim 11 wherein the concentration of hydrofluoric acid is greater than 1 vol %.

15. A method as in claim 11 wherein the concentration of hydrofluoric acid is less than 5 vol %.

16. A method as in claim 11 wherein the doped polysilicon layer further comprises one or more dopants selected from a group consisting of Al, P, N, and Sb.

17. A method as in claim 11 wherein at least one dopant concentration of the doped polysilicon layer is less than $1 \times 10^{18}$ atoms/cm$^3$.

* * * * *